United States Patent [15] 3,663,866

Iosue et al. [45] May 16, 1972

[54] BACK PLANE

[72] Inventors: Michael F. Iosue, Danielson, Conn.; Ronald F. Robinson, Wayne, Pa.; Paul L. Anderson, Rockville; Edwin P. Ziobrowski, Putnam, both of Conn.

[73] Assignee: Rogers Corporation, Rogers, Conn.

[22] Filed: Mar. 27, 1970

[21] Appl. No.: 23,170

[52] U.S. Cl. ..................................317/101 CM, 317/101 CP
[51] Int. Cl. ..............................................................H05k 1/04
[58] Field of Search .................317/101 CM, 101 A, 101 CP; 29/624–627; 339/17 E, 17 LM, 17 LC, 17 M

[56] References Cited

UNITED STATES PATENTS

| | | | |
|---|---|---|---|
| 3,072,874 | 1/1963 | Roney | 317/101 CM UX |
| 3,184,830 | 5/1965 | Lane et al. | 29/625 |
| 3,206,647 | 9/1965 | Kahn | 339/17 E UX |
| 3,351,702 | 11/1967 | Stephens | 317/101 CM UX |
| 3,471,631 | 10/1969 | Quintana | 174/68.5 X |
| 3,500,428 | 3/1970 | Allen | 317/101 A UX |
| 3,509,268 | 4/1970 | Schwartz et al. | 317/101 CM UX |

*Primary Examiner*—David Smith, Jr.
*Attorney*—Fishman and Van Kirk

[57] ABSTRACT

A back plane for use as a power bus which supports and electrically energizes microcircuit chips. The back plane is formed by a laminated structure in which are mounted wire wrap pins that form terminals for the microcircuits. The laminates are sheets of conductive material insulated from one another and the wrap pins are mounted in the laminated structure so that electrical contact for each pin is made with only one of the conductive laminates. There are sufficient wrap pins to provide electrical contact with each of the respective conductive laminates. The laminates also include channels in which microcircuit chips may be mounted. The leads from the chips can be wrapped around the terminal pins which are connected respectively to the laminates energized at appropriate voltage levels.

9 Claims, 4 Drawing Figures

Patented May 16, 1972 3,663,866

INVENTORS
MICHAEL F. IOSUE
RONALD F. ROBINSON
PAUL L. ANDERSON
BY EDWIN P. ZIOBROWSKI

*FISHMAN & VAN KIRK*
ATTORNEYS

BACK PLANE

BACKGROUND OF THE INVENTION

1. Field of the Invention

This invention relates to the field of microcircuitry. More particularly, the invention relates to back planes which are power buses used to support and energize microcircuit chips at various voltage levels.

2. Description of the Prior Art

The field of microcircuitry has gained ever increasing importance as the technology spreads into greater and more diversified product markets. The need for microminiaturization in the area of computers is particularly compelling as the requirements for both general purpose and special purpose computers increase in the various markets. The many functions which must be performed by each type of computer demand many types of integrated circuits. Several circuits may be formed on a single microcircuit chip.

The complexity of the computer circuitry requires a very high standard of reliability from each component and the component assemblies. A single failure of just one component may render the entire computing process inoperative or cause a false output to be produced. The miniaturization of the multiple components introduces a further possibility for error due to the inherent difficulty of working with components of a microminiaturized scale. In spite of the smallness of the electrical components, interconnection of the components with one another and with a power source must be accomplished with a high degree of reliability. Where replaceable integrated circuits are employed, the problem is even more acute.

Back planes have been developed to both support and energize the microcircuits. The back planes are power buses which include a plurality of insulated, conductive laminates to provide different voltage levels. Terminal pins are connected to the respective laminates. The electrical connections between these terminal pins and microcircuits are formed simply by wrapping lead wires from the microcircuit chips around the terminal pins, sometimes designated as wrap pins. Replacement of the circuits is greatly simplified by the wrapping feature where soldering is not required.

The use of back planes in microcircuit technology as standard components makes it desirous that the back planes be manufactured economically and with sound engineering qualities.

It, therefore, is an object of this invention to provide a multilayer back plane which is simple in construction and yet possesses a high degree of reliability when employed in its working environment.

It is a further object of the invention to provide a back plane which is inexpensive to manufacture and which can be readily assembled in a minimum period of time.

SUMMARY OF THE INVENTION

The back plane is a laminated power bus structure composed of multiple layers of conductive sheet material which are insulated from one another by intervening layers of insulation. The electrical isolation of the respective conductive layers permits the back plane to be energized at various voltage levels including a ground plane.

The laminated structure formed by the multiple layers includes a plurality of terminal pins which are electrically connected respectively with one of the conductive layers. The pins bring the various voltage levels through the laminated structure to at least one surface of the back plane for convenient access and provide a simple means for connecting a plurality of microcircuits to various energizing voltages. The terminal pins are supported in channels formed by aligned apertures in each of the layers. The pins are frictionally engaged in selected layers of the laminate structure and electrically connected to the selected layers by means of smaller apertures in the layers. The remaining, electrically dissociated layers of the laminated structure are sealed around the terminal pins with a potting compound which insures electrical isolation of the terminal pins from all but the selected one of the electrically conductive layers. Different terminal pins connect with different conductive layers because the smaller apertures in the various supporting channels are distributed uniquely in the different layers. Multiple groupings of pins can be scattered throughout the laminated structure so that the same voltage level may be picked up at different parts of the exposed surface of the laminated structure.

The laminated structure also contains channels which may be used to support microcircuit chips. These channels are distributed throughout the laminated structure and the terminal pins are interspersed between the microcircuit channels so that the various voltage levels are readily available to any of the microcircuit chips. The microcircuits are readily connected to the desired voltage level by simply wrapping leads from the chip around the terminal pin which provides the appropriate energizing voltage. The pins may have a rectangular cross section to provide a firm electrical contact between the leads and the pins. A convenient pattern for laying out both the terminal pins and the microcircuit channels is a rectangular matrix wherein the pins and channels are located in alternate rows and diagonally offset with respect to one another.

The back plane is assembled by first installing the square wrap lins in the smaller apertures of the separate layers. The smaller apertures are round and have a diameter slightly less than the diagonal of the square pin. After the pins have been forced into the smaller apertures, swaging tools are slipped over the pins and swage the conductive material around the pin to fill the remaining voids between the square pin and the layer. Several layers are then stacked with intervening layers of insulation to form the laminate structure and the potting compound is poured into the pin channels to seal the structure.

BRIEF DESCRIPTION OF THE DRAWINGS

In the drawings, wherein like elements are numbered alike in the several figures.

DESCRIPTION OF THE PREFERRED EMBODIMENTS

Figure 1:
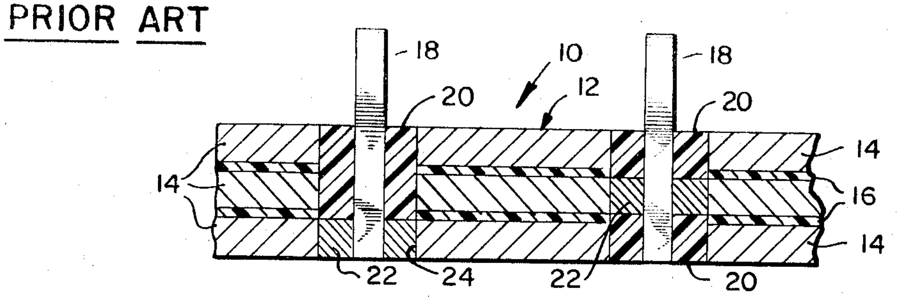
FIG. 1 PRIOR ART
FIG. 1 shows the construction of the back plane as is known from the prior art.

Back planes as they are presently known are shown in FIG. 1. The back plane, generally designated by the numeral 10, is composed of a laminate structure 12 formed by multiple layers of conductive sheets 14 separated by intervening layers of insulation 16. Scattered throughout the structure 12 are terminal pins 18. The pins 18 are supported in the structure 12 by means of both insulating bushings 20 and conductive bushings 22. The bushings 20 are made from an insulating material such as nylon. The conductive bushings 22 may be serrated on their outer circumference so they can be pressed into the apertures 24 of the conductive laminates and held in place. If the terminal pins 18 are to be soldered to the conductive bushings 22, such soldering must be done prior to installation in the structure 12. In order to make proper contact with a selected one of the conductive layers 14, the bushings 22 must be precisely located at selected axial stations along the terminal pins prior to installation. Since the location of the bushings 22 characterizes which of the conductive laminates 14 will be contacted and because the terminal pins and bushings must be prefabricated prior to installation, the pins 18 are not indiscriminately interchangable. Specific pins and associated bushings can only be installed in particular channels of the back plane. Furthermore, to prevent contact between two of the conductive laminates 14, the precise station of the bushing 22 within the structure 12 must be accurately controlled during installation and thereafter.

Figure 2:
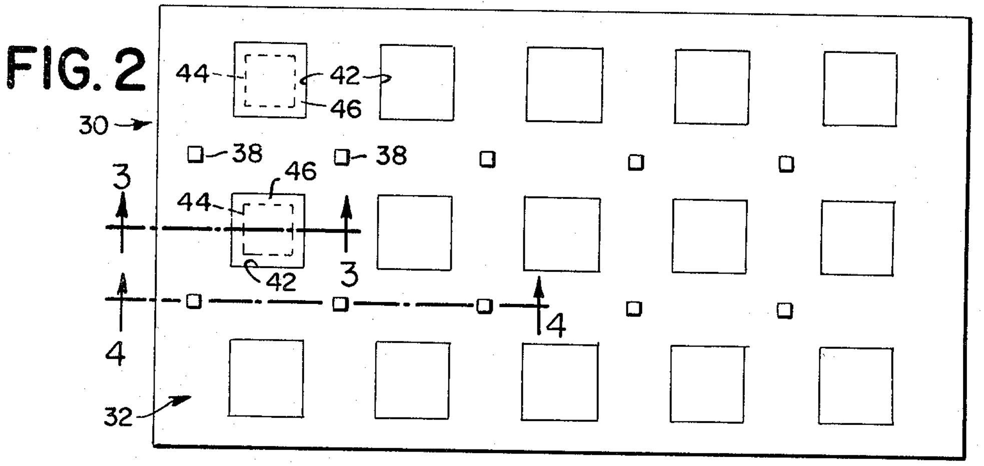
FIG. 2 is a plan view of the back plane of the present invention showing both the terminal pins and the microcircuit chips in place.
Figure 3:
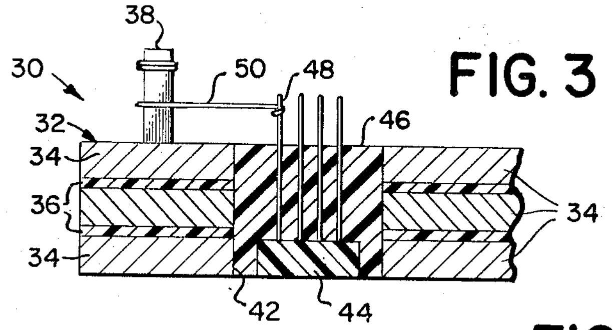
FIG. 3 is a sectional view through the back plane of FIG. 2 as viewed along the section line 3—3.
Figure 4:
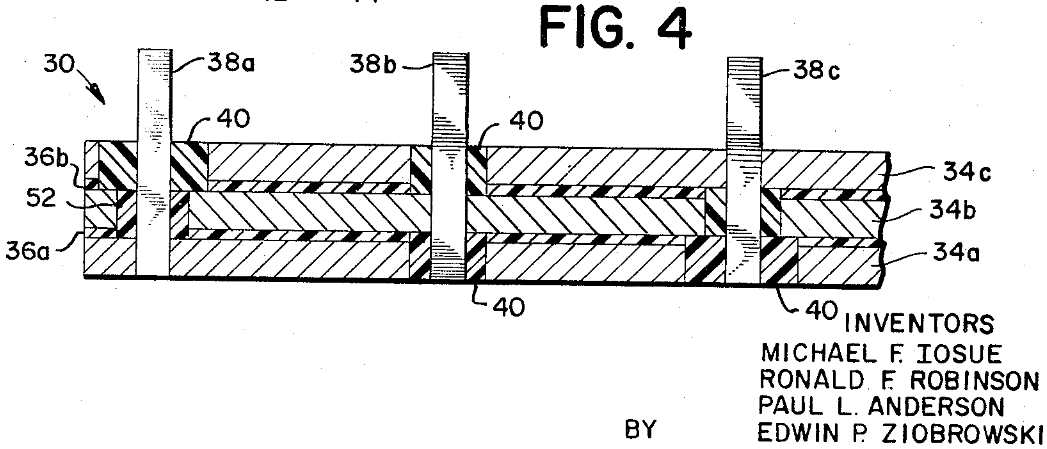
FIG. 4 is a sectional view through the back plane of FIG. 2 as viewed along the section line 4—4.

FIGS. 2–4 disclose the improved back plane of the present invention. The improved back plane, generally designated 30, includes a laminate structure 32 formed by layers 34 of conductive sheet material which are electrically isolated from one another by intervening layers of insulation 36. The back plane 30 also includes terminal pins 38 which are secured in close fitting contact with selected conductive layers 34 for electrical continuity and are insulated from the remaining layers 34 by means of a potting compound 40.

As seen more clearly in FIG. 2 the pins 38 are located in rows throughout the laminate structure 32. The laminate structure 32 also defines a plurality of chip channels 42 similarly located in alternate rows. The pins 38 and channels 42 are diagonally offset from one another in a rectangular matrix pattern to provide convenient access to the pins 38 from as many adjacent chip channels as possible. The channels 42 serve as receptacles for mounting microcircuit chips 44 in plastic plugs 46. The plugs 46 fit securely within the channels 42 and are held in place principally by frictional contact at the walls of the channels 42.

The chips 44 contain integrated circuitry and as seen more clearly in FIG. 3, the leads 48 from the chip 44 extend from the plug 46 adjacent the surface of the back plane 30 from which the pins 38 project. The electrical connection between the pins 38 and leads 48 is provided by a wrapping wire 50 which is simply wrapped at its ends to the pin 38 and leads 48. Of course, if the leads 48 themselves are sufficiently long, the leads may be wrapped directly on the pins 38 without wire 50.

It will be understood that the leads 48 are identified with given voltages and the wrapping wires 50 interconnect the leads with selected pins 38 that provide the required voltages. By locating the channels 42 and the pins 38 in alternate rows with diagonal offsets between the pins and the channels, it is possible to provide a plurality of voltage potentials within a short distance of each chip 44. While the precise pattern of pins 38 and channels 42 shown in FIG. 2 is a rectangular matrix, it may be preferable in certain environments to employ a triangular, circular or some other pattern which intersperses the pins at regular intervals with respect to the channels 42.

It will be noted from FIG. 2 that the pins 38 have a square cross-section. Such pins are desirable particularly where the connection between the chip 44 and the pin 38 is provided by the wrapping wire 50. The square corners of pins 38 aid in securing the wrapped wire in firm electrical contact with the pins. Such connections are simple to make and can be readily undone when it is desired to replace the chip 44 because of a failure of the chip itself or because of a desired change in the assembled circuitry.

FIG. 4 discloses the back plane 30 in greater detail and particularly shows the construction which distinguishes the present back plane 30 from the back planes 10 of the prior art (FIG. 1). The individual terminal pins 38 and the conductive layers 34 are distinguished in FIG. 4 by letter suffices added to the identifying numerals.

Since the back plane 30 is composed of several conductive layers 34 which may be respectively energized at different voltage levels and because the various voltages must be available at different terminal pins 38, there will be only one connection between a given pin 38 and any one of the conductive layers 34. The layers 34 are electrically isolated by the insulation 36 which may also be an adhesive bonding compound to hold the laminated structure 32 together. Isolation between the pins 38 and the electrically dissociated layers 34 is provided in the present embodiment by the potting compound 40. The compound 40 additionally provides both support and hermetic sealing to prevent electrical leakage between pin 38 and the dissociated layers 34. This potting compound 40 therefore offers several improvements over the nylon insulators 20 employed in the prior art back planes 10. Apart from the improvements, the compound 40 is less expensive and facilitates the assembly of the back plane 30.

It will be noted that each of the pins 38 is mounted in direct contact with one of the conductive layers 34. More specifically, the pin 38*a* is connected with layer 34*a*; pin 38*b*, with layer 34*b*; and pin 38*c*, with layer 34*c*. This direct connection between the pin and the layer eliminates the need for a conductive bushing 22 used in the prior art back planes 10. The pins 38 are mounted in channels formed by apertures in the layers 34 and 36 which register with one another from layer to layer. One of the aperture in the conductive layers 34 in each channel is smaller than the other apertures so that the pin 38 can be pressed into frictional engagement with the one layer and thereby secure an electrical connection with the one layer. Because the friction connection between the pin and the one conducting layer is direct, a standard pin can be used to connect with any one of the conductive layers 34. No special conductive bushing need be soldered or mounted at a precise axial station on the pin 38. Furthermore even if the pin 38 should not be precisely located axially within its channel, there is no opportunity for short circuiting two of the layers together as might occur in the prior art back planes 10. This feature greatly facilitates the manufacture of the back plane 30 since extreme accuracy in locating the pins is not required. Additionally, the absence of an extra conductive bushing renders the back plane 30 less expensive to construct.

The further advantage gained by the construction of the back plane 30 is achieved by the use of various sized apertures to define the pin-supporting channels. It will be noted that the alignment of the pin-supporting apertures in the back plane 30 is not as critical as the alignment of the corresponding apertures in the prior art back plane 10. In the prior art back plane 10, the bushings 20 and 22 must be coaxially aligned to accommodate the pins 18. The alignment of the bushings 20 and 22 in turn requires an accurate correspondence of the surrounding apertures in both the conductive layers 14 and the insulating layers 16. Such critical alignment is unnecessary where the potting compound 40 is used to fill the annular space between the pin 38 and the electrically dissociated layers.

A still further advantage gained by the use of various sized pin-supporting apertures and the potting compound 40 is that the sealing function performed by the compound 40 prevents moisture from seeping past the pins 38 into the intervening regions of the various layers 34 and 36. It will be noted that the smaller aperture in the layer 34*a* connected to the pin 38*a* is circumscribed by a small annular area 52 on the surface of the layer 34*a* which is adjacent the larger aperture in the adjacent layer 36*a*. The small annular area 52 surrounding pin 38*a* is completely sealed by the potting compound 40. Moisture which might attempt to pass the pin 38*a* is prevented from reaching the region between layers 34*a* and 36*a*. A completely sealed mounting of the pins can be assured by applying a small quantity of potting compound over the end of pin 38*a* at the exposed surface of layer 34*a* and a small ring of potting compound around the pin 38*c* on the exposed surface of layer 34*c*. Of course, a completely sealed structure presumes that the plastic mounting blocks 46 which support the chips 44 would be similarly sealed at the exposed surfaces of layers 34*a* and 34*c*.

The improved structure of the back plane also simplifies its manufacture. The conductive layers 34 for each voltage level are formed with apertures in a preselected pattern, the smaller apertures for receiving the wrap pins being uniquely distributed in the different layers in the same manner as the corresponding pins at common voltages are to be distributed in the assembled back plane. Apertures can be readily formed in the thin conductive layers by a die stamping process. The smaller apertures, in the preferred form of the invention, are initially round and have a diameter slightly smaller than the diagonal of the square wrap pins but larger than the one side of the square pin. The wrap pins are then installed at the appropriate elevations in the smaller apertures of the individual conductive layers. Swaging tools are then slipped over the pins and work the conductive material around the square pins into the voids between the pins and the associated layers to provide a firm frictional engagement with positive electrical continuity. This installation of the pins is greatly simplified over the prior art process of manufacturing back planes because the criticality of locating pins in bushings and bushings in the layers is virtually eliminated. The various conductive layers with the pins are then assembled in a laminated structure with intervening layers of insulation. The layers may be bonded together by means of the intervening layers of insulation or may be mechanically secured by clamps. The pins in the channels formed by the registering apertures are then surrounded with the potting compound to hermetically seal the laminated structure.

When the back plane is installed in a computer or other working environment, the various microcircuit chips 44 are positioned within the larger channels 42. Each of the conductive layers is connected electrically through bussing straps to different voltage terminals of an electrical power source. In this manner, various voltage levels from a large scale power source are made readily available within a short distance of a plurality of microminiaturized circuit modules.

While particular embodiments of the novel back plane 30 have been disclosed, it will be recognized by those skilled in the art that various modifications and substitutions can be made. For example, while three conductive layers 34 with intervening insulating layers 36 have been shown, a greater or lesser number of conductive layers can be provided so long as they are separated by intervening layers of insulation. Additionally, it may be desirable in some embodiments to electrically interconnect certain of the conductive layers 34 by means of the pins 38 themselves. In such instances, it is merely necessary to provide frictional engagement of the common pin 38 with small apertures in both of the layers to be interconnected. The density of pins 38 and channels 42 may be varied according to particular needs and, of course, the number of rows and length of the back plane can be varied without affecting the essential purpose of the back plane. In its preferred form the minimum pin spacing, center to center, should be at least four times the thickness of the pin. The particular materials which are employed to construct the back plane may be varied. If a copper sheet is employed as the conductive layer, the thickness of the sheet should not be less than 0.040 inch. Any suitable electrical compound commonly used for hermetic sealing and insulating is acceptable. In one form the back plane is composed of sheets of copper having a thickness of 0.062 inch. The insulation is DUROID 2520, an epoxy non-woven glass material available from Rogers Corporation, Rogers, Connecticut, having a thickness of 0.005 inch, and the terminal pins 38 are beryllium-copper alloy having a square cross section, 0.025 inch on the side.

What is claimed is:

1. A multiple voltage power bus comprising:

a laminate structure composed of at least two layers of electrically conductive material and at least an intervening layer of insulating material, the layers defining a first array of channels extending through the laminate structure normal to the layers, the first array of channels being formed by apertures in the layers, each channel of said first array having at least one aperture in one of the electrically conductive layers which is of reduced cross-sectional area when compared to the aperture in the layer of insulating material defining that channel, and each electrically conductive layer having at least one of the apertures of reduced cross-sectional area, the layers further defining a second array of channels extending through the laminate structure and interspersed at regular intervals with respect to the channels defining the first array, the channels of said second array each being of uniform cross-sectional area;

electrically conductive terminal pins mounted in each channel of said first array in close-contact with the apertures in the layers of conductive material having reduced cross-sectional area whereby electrical contact is established between said layers having apertures of reduced area and the terminal pins;

insulating means interposed in said channels of said first array between the terminal pins and the electrically conductive layers which are not in contact therewith;

electrical circuit component means mounted in the channels of said second array, said component means having conductors extending outwardly therefrom with respect to said laminate structure; and means displaced from the surface of said laminate structure for electrically connecting said conductors to selected of said terminal pins.

2. The multiple voltage power bus of claim 1 wherein said electrical component means comprises:

microcircuit means; and nonconductive supporting means for said microcircuit means.

3. The multiple voltage power bus of claim 2 wherein:

the insulating means is also a hermetic sealing means surrounding the terminal pins.

4. The multiple voltage power bus to claim 2 wherein:

the first and second arrays of channels are distributed throughout the layers in a rectangular matrix pattern.

5. The multiple voltage power bus of claim 2 wherein:

the channels of said first array are in rows; and the channels of said second array are in rows alternately spaced between the rows of the first array of channels and are diagonally offset with respect to the first array of channels.

6. The multiple voltage power bus of claim 3 wherein:

the terminal pins are frictionally mounted in the smaller apertures of the respective electrically conductive layers.

7. The multiple voltage power bus of claim 6 wherein:

the terminal pins are wire wrap pins having a square cross section.

8. The multiple voltage power bus of claim 7 wherein:

the interval between adjacent pins is no less than four times the thickness of the pins.

9. The multiple voltage power bus of claim 8 in which the electrically conductive layers are copper laminates no less than 0.040 inch in thickness.

* * * * *